(12) United States Patent
Achkir

(10) Patent No.: US 9,256,037 B2
(45) Date of Patent: Feb. 9, 2016

(54) VARIABLE OPTICAL ATTENUATOR

(71) Applicant: Cisco Technology, Inc., San Jose, CA (US)

(72) Inventor: Brice D. Achkir, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/579,726

(22) Filed: Dec. 22, 2014

(65) Prior Publication Data

US 2015/0153519 A1 Jun. 4, 2015

Related U.S. Application Data

(62) Division of application No. 13/398,478, filed on Feb. 16, 2012, now Pat. No. 8,938,148.

(51) Int. Cl.
*G02B 6/00* (2006.01)
*G02B 6/42* (2006.01)
*G02B 6/26* (2006.01)
*H01L 41/31* (2013.01)

(52) U.S. Cl.
CPC ........ *G02B 6/42* (2013.01); *G02B 6/266* (2013.01); *H01L 41/31* (2013.01); *Y10T 156/1062* (2015.01)

(58) Field of Classification Search
CPC ................................ G02B 6/266; H01L 41/31
See application file for complete search history.

(56) References Cited

U.S. PATENT DOCUMENTS

| | | | |
|---|---|---|---|
| 4,268,116 A * | 5/1981 | Schmadel | ............ G02F 1/0134 367/140 |
| 4,697,869 A | 10/1987 | So et al. | |
| 5,390,266 A | 2/1995 | Heitmann et al. | |
| 5,561,726 A | 10/1996 | Yao | |
| 5,619,600 A | 4/1997 | Pohl | |
| 6,973,253 B2 | 12/2005 | Steinberg et al. | |
| 6,985,235 B2 | 1/2006 | Bao et al. | |
| 7,054,519 B1 | 5/2006 | Novotny | |
| 7,450,812 B2 | 11/2008 | Romo et al. | |
| 7,542,645 B1 | 6/2009 | Hua et al. | |
| 8,478,087 B2 * | 7/2013 | Farber | ...................... G02B 6/14 359/359 |
| 2003/0128361 A1 | 7/2003 | Kuroda et al. | |
| 2004/0196522 A1 | 10/2004 | Lee et al. | |
| 2005/0069248 A1 | 3/2005 | Jasti et al. | |
| 2008/0253714 A1 | 10/2008 | Poovey | |

OTHER PUBLICATIONS

SFF Committee, INF-8074i Specification for SFP (Small Formfactor Pluggable) Transceiver, Rev. 1.0, 38 pages, May 12, 2001.

* cited by examiner

*Primary Examiner* — Omar R Rojas

(57) ABSTRACT

In one embodiment, a variable optical attenuator includes a core configured to propagate optical data signals and a cladding surrounding at least part of the core and comprising a first cladding portion and a second cladding portion. An attenuating spacer between the first cladding portion and the second cladding portion is formed from a smart material. The smart material is configured to apply a force to at least one of the first cladding portion and the second cladding portion in response to an external stimulus. The smart material may be a piezoelectric material and the external stimulus may be an electrical current.

20 Claims, 6 Drawing Sheets

100

VARIABLE OPTICAL ATTENUATOR

CROSS-REFERENCE TO RELATED APPLICATIONS

This application is a divisional of U.S. application Ser. No. 13/398,478, filed Feb. 16, 2012, which is incorporated by reference in its entirety.

FIELD

The present disclosure relates to a variable attenuator for optical communication.

BACKGROUND

Optical communication links have been deployed to transport data from one point to another. Optical communication links are capable of greater speeds and/or bandwidths than traditional electrical signals in copper wires or coaxial cables. Optical communication links have been used in client-to-client or trunk-to-core systems in the telecommunications industry.

To insure that receivers are not damaged or overloaded, attenuators are added to the optical communication links. In optical networks utilizing power lasers or wavelength division multiplexing applications, attenuators protect the receivers from saturation or other damage. Also, attenuators are used to test the performance of an optical product through parametric testing such as the receiver sensitivity or functional testing (e.g., attenuated loop backs). However, the attenuators are mechanically bulky and cannot be implemented in smaller applications.

DETAILED DESCRIPTION

Overview

In one aspect, an apparatus includes a core, a class and an attenuating space. The core is configured to propagate optical data signals. The cladding surrounds at least part of the core and comprising a first cladding portion and a second cladding portion. The attenuating spacer is between the first cladding portion and the second cladding portion, and the attenuating spacer is formed from a smart material configured to apply a force to at least one of the first cladding portion and the second cladding portion in response to an external stimulus.

In a second aspect, a method includes propagating at least one optical data signal in a transmission path, receiving an external stimulus configured to stimulate a piezoelectric material adjacent to the transmission path, and attenuating the at least one optical data signal according to a gap in the transmission path created by the piezoelectric material energized by the external stimulus.

In a third aspect, a method includes cleaving an optical fiber into a first portion and a second portion, wherein the optical fiber comprises a core and a cladding, removing a portion of the cladding from the first portion of the optical fiber, inserting a smart material in place of the portion of the cladding, and rejoining the first portion of the optical fiber and the second portion of the optical fiber.

EXAMPLE EMBODIMENTS

Optical attenuators that are mechanical or micro-electrical-mechanical systems (MEMS) based are bulky and implementation in optical backplanes or optical modules can be difficult. In one example a mechanical attenuator involves wrapping the optical fiber around a mechanical device to create a bend radius. A signal propagation loss is created depending on the bend radius. In a MEMS based optical attenuator, the angle of a mirror used for reflection is adjusted to introduce a signal propagation loss. Alternatively, in a MEMS based optical attenuator, an electrostatic force moves a beam splitter between a transmitting part and a receiving part to create a signal propagation loss.

The following embodiments describe a variable optical attenuator that incorporates a smart material to introduce the signal propagation loss. The smart material may be a piezoelectric material defined by a property that when the piezoelectric material is stimulated with a current, the size of the piezoelectric material changes. Conversely, if a pressure is applied to the piezoelectric material, the piezoelectric material generates a current. As the size of the piezoelectric material changes, the signal propagation loss changes. The size of the signal propagation loss can be accurately controlled as a function of time.

Figure 1A:
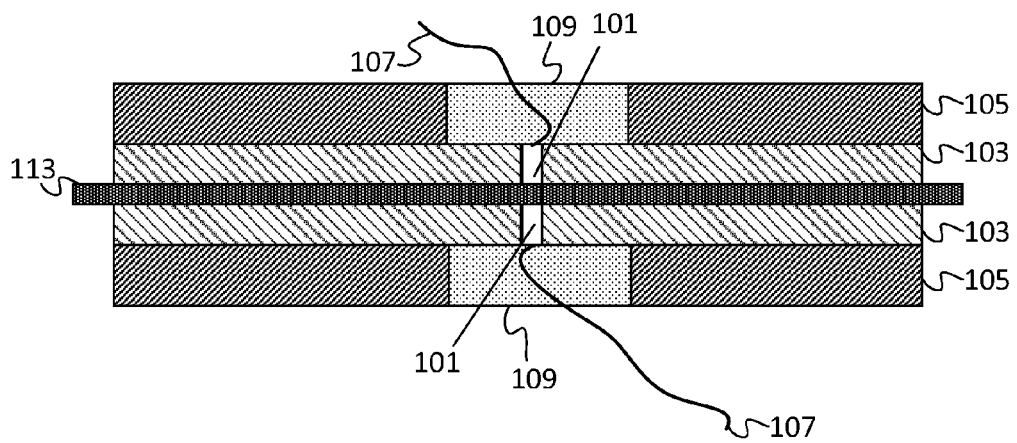
FIG. 1A illustrates a variable optical attenuator in a de-energized state.

FIG. 1A illustrates a variable optical attenuator 100 in a de-energized state. The variable optical attenuator 100 includes a core 113, a cladding 103, a protection layer 105, a flexible ring 109, an attenuating spacer 101, and a pair of wires 107, such as copper wires, which may be any type of conductive member. The wires may be thin having a diameter as small as 34 gauge copper wires.

The core 113 is formed from a transparent material and is configured to carry light. The transparent material may be glass, silica, fluorozirconate, fluoroaluminate, chalcogenide, sapphire, quartz or another material with a refractive index conducive to light traveling therethrough, such as a refractive index greater than one. The optical fiber, or specifically core 113, may be referred to as a waveguide or light pipe. The core 113 may have a diameter of 1-100 microns (e.g., 9 microns, 50 microns).

The cladding 103 is formed from a transparent material. The cladding 103 has an index of refraction that is lower than an index of refraction of the core 113 to create an internal reflection of light for optical communication. The cladding 103 may be formed of any of the materials of the core, such as a doped glass, or a plastic. The cladding 103 may be 10-500 microns (e.g., 100 microns, 125 microns) in thickness. The cladding 103 may be coated on the core 113.

The protection layer 105 is a buffer that protects the optical fiber from moisture and physical damage. The protection layer 105 may be an ultraviolet cured acrylate or a plastic material. The protection layer 105 may include two layers including an inner layer used as a shock absorber and an outer layer to protect against physical damage. The protection layer 105 may be 10-500 microns (e.g., 100 microns) in thickness. In other examples, other forms of a buffer may be used, and the protection layer 105 may be omitted.

The attenuating spacer 101 is formed from a smart material such as piezoelectric material. A smart material is any material with a property that may be controlled by an external stimulus. The external stimulus may be an electrical current, a magnetic field, a temperature, or another stimulus. For example, the piezoelectric material may expand when an electric current is applied to the piezoelectric material. Alternatively or in addition, the piezoelectric material may bend or otherwise change shape in response to the electric current or any other external stimulus. Piezoelectric materials include crystals, ceramics, and other non-conductive materials. Example piezoelectric materials include berlinite, quartz, topaz, Rochelle salt, silk, barium titanate, lead titanate, niobates, tantalite, zinc oxide, lead zirconate titanate, and other materials.

Additional smart materials include shape memory materials, magnetostrictive materials, and temperature-responsive polymers. Shape memory materials are configured to "remember" an original shape. When the shape memory material is at a first temperature below a transition temperature, the shape memory material can be deformed to hold any shape. When the shape memory material is heated above a transition temperature, the shape memory material returns to the original shape. Magnetostrictive materials change shape in response to a magnetic field. Temperature-responsive polymers change shape in response to temperature changes. In other examples, any other material that is responsive to external stimulus may be used.

Figure 1B:
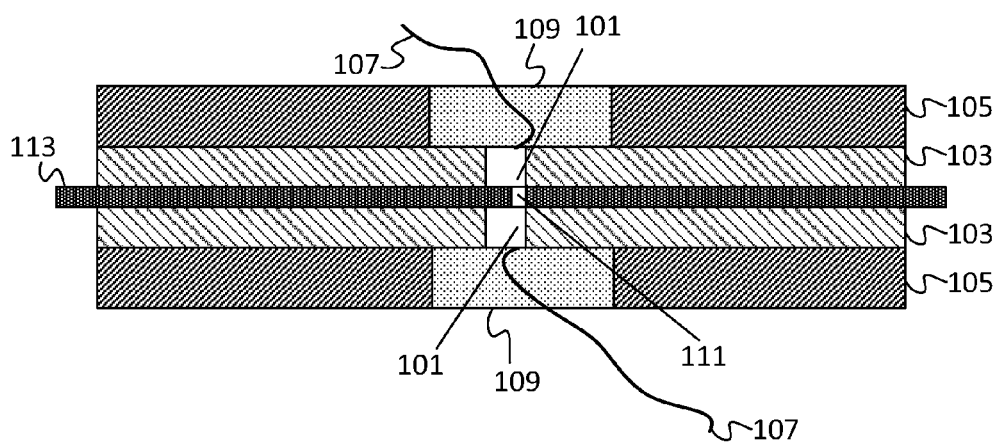
FIG. 1B illustrates a variable optical attenuator in an energized state.

FIG. 1B illustrates the variable optical attenuator 100 in an energized state. The attenuating spacer 101 may receive the external stimulus (e.g., electrical current) through a pair of wires 107, such as copper wires, or other conductive material. The attenuating spacer 101 is positioned between a separation in the cladding 103 defining a first cladding portion and a second cladding portion. When the external stimulus is applied to the attenuating spacer 101, the smart material changes shape, which exerts a force on either the first cladding portion or the second cladding portion or both. The force separates the first cladding portion and the second portion, which creates a gap 111 in the core 113. The gap 111 does not prevent the transmission of the optical data signals in the core 113, but attenuates the optical data signals. The attenuation may be caused by light scattering, light absorption, or both.

For the piezoelectric material, a relationship between the change in size of the piezoelectric material and the applied current may be linear. Further, a relationship between the size of the gap 111 and the attenuation may be linear. Accordingly, the relationship between the applied electrical signal (current or voltage) and the attenuation may be linear. The attenuation may be expressed in power units (e.g., mW), decibels (dB), or decibels per milliwatt (dBm). An example attenuation of 10 dB may be achieved using a 10 mA current at 3.3 V, using for example, a zinc oxide based piezoelectric ceramic material.

An example equation for a relationship between the electrical current (I) applied to the piezoelectric material having a piezoelectric constant (Q) and a size (G) of the gap 111 in the core 113 is $G=Q*I$, varying with respect to the piezoelectric material. An example relationship between the attenuation in dBm and the size of the gap may be $10*\log(k*G)$, where k is a loss constant for air.

The flexible ring 109 surrounds and protects the attenuating spacer 101. The flexible ring 109 flexes as the attenuating spacer 101 changes shape. The flexible ring 109 may be formed from any flexible material such as plastic or cotton. The flexible ring may have a thickness of 10-500 microns and a length of about 2 cm. In other examples, any other form of protective flexible material may be used instead of flexible ring 109.

The optical data signals in the core 113 may include a single channel or multiple channels. Single mode fibers may operate at 1310 or 1550 nm, for example. Multiple channels in multi-mode fibers are created using optical data signals at different wavelengths. The core 113 may be larger (e.g., 50-100 microns) in multiple channel applications. The cladding 103 may also be larger and in the range of 100-1000 microns (e.g., 125 microns). Each channel in the multi-mode fiber is associated with a specific frequency or wavelength. Example wavelengths include 1550 nm, 1551 nm, 1552 nm, etc.

A single core 113 may include 16, 64, 128, or more channels. The average power for the cable increases as multiple optical data signals are used. The multiple channels in the fiber optic cable may experience different attenuations along the length of the fiber optical cable.

Figure 2:
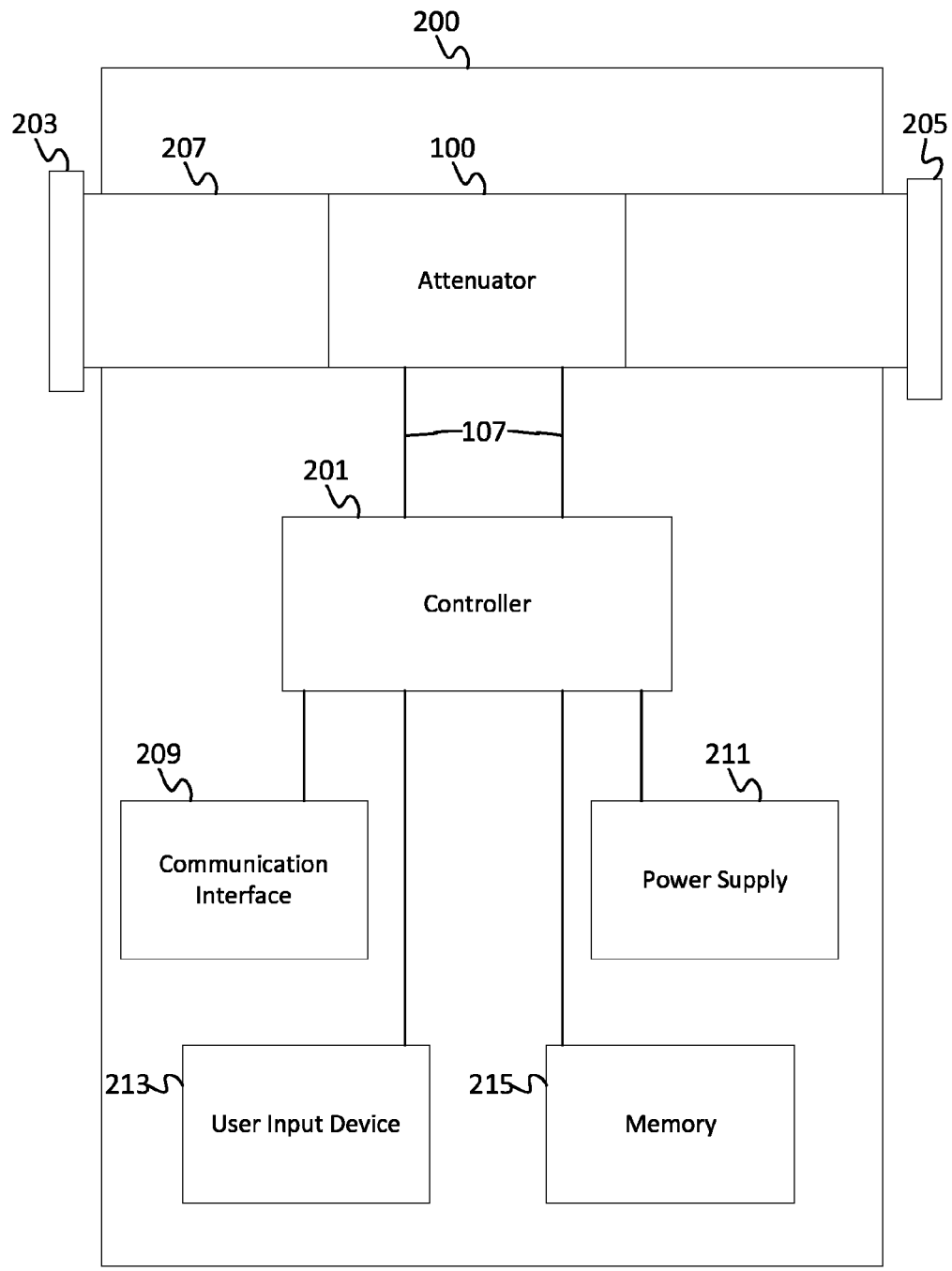
FIG. 2 illustrates an example implementation of the variable optical attenuator of FIGS. 1A and 1B in a network device.

FIG. 2 illustrates an example implementation of the variable optical attenuator 100 of FIGS. 1A and 1B in a network device 200. The network device 200 may be any optical link such as a small form-factor pluggable (SFP) transceiver, an optical transmitter, or an optical receiver. The SFP transceiver interfaces a switch or a router to a fiber optic cable. In other words, the SFP transceiver converts optical signals to electrical signals and vice versa. The SFP transceiver may be configured to support synchronous optical networking (SONET), Gigabit, Ethernet, Fibre Channel, or other communication standards. The SFP transceiver may also include a color coding extraction lever that describes the wavelength, single-mode or multi-mode, and suitable transmission distance. The network device 200 may be an optical transport platform such as the Cisco ONS 15540, Cisco ONS 15530, or Cisco ONS 15454.

The variable optical attenuator 100 is placed in the network device between the first interface 203 and the second interface 205 in a short piece of fiber optic cable 207. In one example, the network device includes a first interface 203 in communication with switch or the router and a second interface 205 in communication with the fiber optic network. The second interface 205 may include an LC connector, an SC connector, or an FC connector. The insertion loss of the connector may be 0.5 dB or less and the insertion loss of the variable optical attenuator 100 may be 0.1 dB or less. Alternatively, variable optical attenuator 100 may be a self-contained device or integrated within an optical cable.

The network device also includes a controller 201, a communication interface 209, a power supply 211, a user input device 213, and a memory 215. The controller 201 generates a control signal including a setpoint to control the variable optical attenuator 100. The control signal may be an electrical signal, which may be generated or set based on an electrical current or a voltage. The electrical signal may be dependent on the resistance of the smart material in the variable optical attenuator 100. The control signal may be determined internally by the controller 201 or based on a command received externally. The control signal, and accordingly, the attenuation, can vary as a function of time. The setpoint and/or the command may be associated with an attenuation value, a size value for the air gap, or a scale factor between a minimum value and a maximum value (e.g., a scale factor of 70 on a scale from 1 to 100).

The command received externally may be a user input. The user input device 213 may include a dial or key pad for entering an attenuation setting. The controller 201 receives the attenuation setting and generates the control signal. Alternatively, the controller 201 may be omitted and the signal from the user input device 213 is fed directly to the variable optical attenuator 100 via the wires 107.

Alternatively, the control signal may be generated based on a command received at the communication interface 209. The command may include the setpoint as described above. The communication interface 209 may be in communication with another network device either through the electrical network connected to the first interface 203 or the optical network connected to the second interface 205. The command signal may originate with a computer on the Internet. In one alternative, the controller 201 is omitted and the signal from the communication interface 209 is fed directly to the variable optical attenuator 100 via the wires 107.

The memory 215 includes a table for converting the command received from the communication interface 209 or the user input device to the external stimulus, such as an electrical signal appropriate for the requested attenuation. The power supply 211 may be a battery, or any other power source that is isolated from the electrical network and the optical network. The power supply 211 supplies power to the controller 201.

Figure 3:
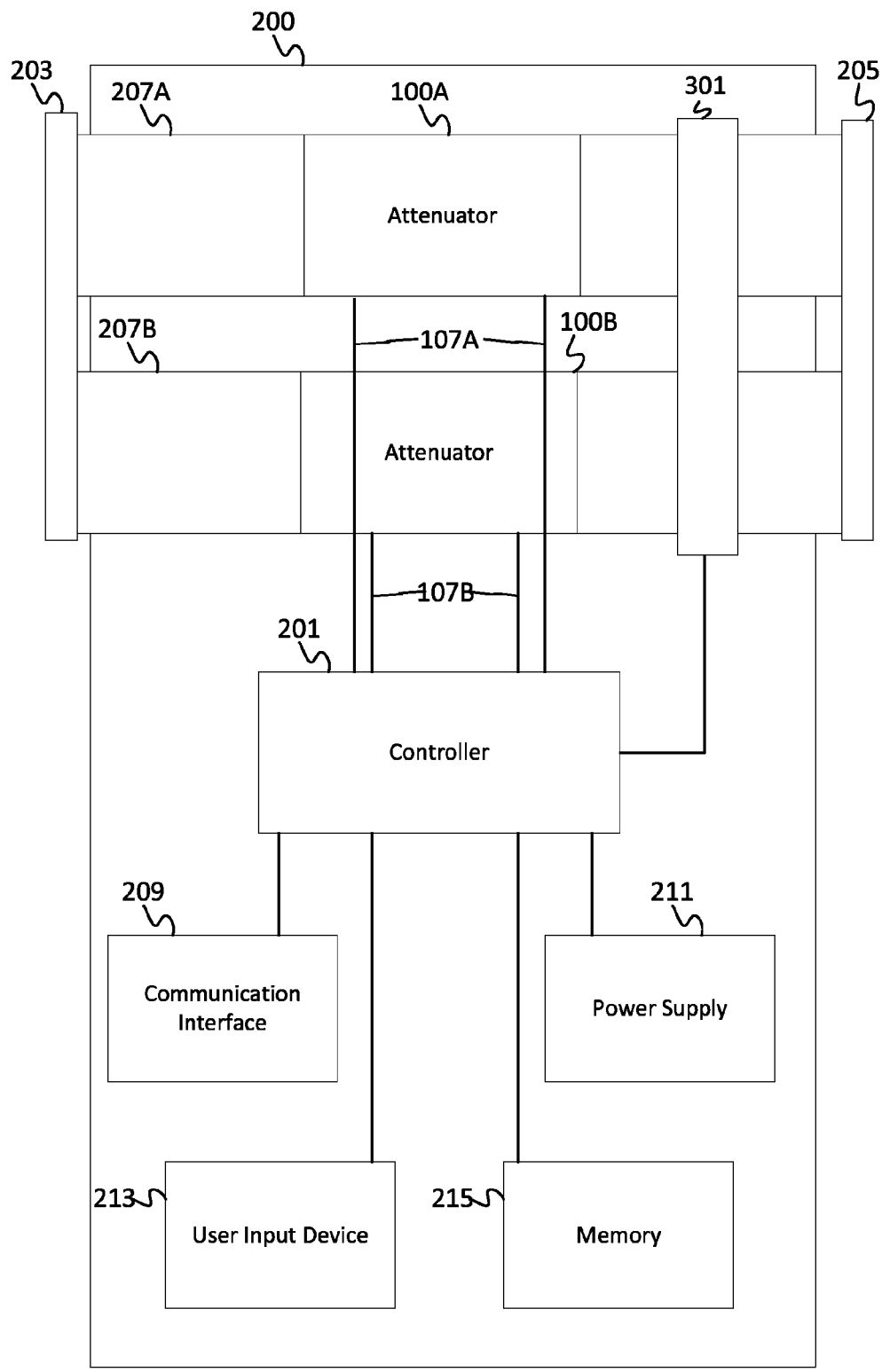
FIG. 3 illustrates another example implementation of the variable optical attenuator of FIGS. 1A and 1B in a network device.

FIG. 3 illustrates another example implementation of the variable optical attenuator 100 of FIGS. 1A and 1B in the network device 200. In the implementation of FIG. 3, the control signal is generated internally at the controller 201 based on a detected power level of the optical data signals. An optical sensor 301 connected on the optical side of the variable optical attenuator 100 detects a power level of the optical data signal. The optical sensor 301 may be an optical power meter and/or may include a photodiode.

The controller 201 receives a detection signal from the optical sensor 301 and generates the control signal based on the detection signal. In single mode operation (not shown), the controller 201 may generate the control signals or determine an attenuation level based on predetermined values of the detection signal, such as by querying a lookup table stored in memory 215 to determine the control signal or attenuation level from the detection signal.

In a multi-mode implementation, as shown in FIG. 3, the optical sensor 301 detects a power level for each of the multiple channels. Optical data signals are demultiplexed such that each channel of the multiple channels is propagated through a separate fiber optic cable 207A and 207B in the network device 200. Each fiber optic cable 207A and 207B includes a different and independent variable optical attenuator 100A and 100B. The controller 201 is configured to compare the power levels for each of the channels. The channels experience different attenuations in the optical network based on distance traveled and the respective wavelengths of the channel signals. The controller 201 may be configured to "even out" the channels by attenuating each of the channels to a lower power level.

In other words, the controller 201 is configured to compare a plurality of power levels received from the optical sensor. The controller 201 selects a lowest power level from the plurality of power levels. The controller 201 calculates an attenuation amount based on a difference between the lower power level and each of the other power levels. The controller 201 is configured to send a first attenuation signal to the variable optical attenuator 100A using the first wires 107A and a second attenuation signal to the variable optical attenuator 100B using the second wires 107B.

The memory 215 may be any known type of volatile memory or a non-volatile memory. The memory 215 may include one or more of a read only memory (ROM), dynamic random access memory (DRAM), a static random access memory (SRAM), a programmable read only memory (PROM), a flash memory, an electronic erasable program read only memory (EEPROM), random access memory (RAM), or other type of memory. The memory 215 may include an optical, magnetic (hard drive) or any other form of data storage device. The memory 215 may be located in a remote device or a removable device, such as a secure digital (SD) memory card.

The user input device 213 may include one or more buttons, keypad, keyboard, mouse, stylist pen, trackball, rocker switch, touch pad, voice recognition circuit, or other device or component for inputting data to the controller 201.

The controller 201 may execute computer executable instructions. The computer executable instructions may be included in computer code. The computer code may be written in any computer language, such as C, C++, C#, Java, Pascal, Visual Basic, Perl, HyperText Markup Language (HTML), JavaScript, assembly language, extensible markup language (XML) and any combination thereof.

The computer code may be stored in one or more tangible media or one or more non-transitory computer readable media for execution by the controller 201. A computer readable medium may include, but is not limited to, a floppy disk, a hard disk, an application specific integrated circuit (ASIC), a compact disk CD, other optical medium, a random access memory (RAM), a read only memory (ROM), a memory chip or card, a memory stick, and other media from which a computer, a processor or other electronic device can read.

The controller 201 may include a general processor, digital signal processor, application specific integrated circuit, field programmable gate array, analog circuit, digital circuit, server processor, combinations thereof, or other now known or later developed processor. The controller 201 may be responsive to or operable to execute instructions stored as part of software, hardware, integrated circuits, firmware, microcode or the like.

The communication interface 209 is in communication with the circuit divider circuit 100. The communication interface 209 may be in communication with the remote devices by way of the Internet. The communication interface 209 may include any operable connection. An operable connection may be one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other or through one or more intermediate entities (e.g., processor, operating system, logic, software). Logical and/or physical communication channels may be used to create an operable connection. As used herein, the phrases "in communication" and "coupled" are defined to mean directly connected to or indirectly connected through one or more intermediate components. Such intermediate components may include both hardware and software based components.

Figure 4A:
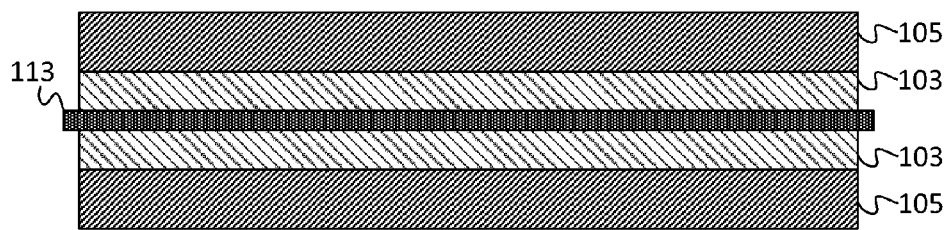
FIGS. 4A-4D illustrate a sequence for manufacturing a variable optical attenuator.
Figure 4B:
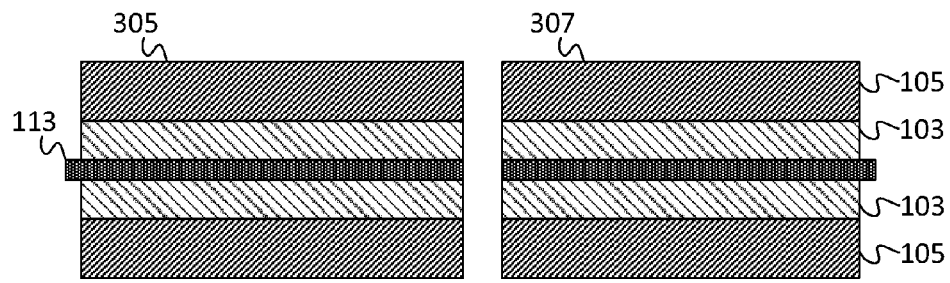

FIGS. 4A-4D illustrate a sequence for manufacturing the variable optical attenuator 100. FIG. 4A illustrates a length of fiber optic cable or optical waveguide including a core 113, a cladding 103, and a protective layer 105, as discussed above. FIG. 4B illustrates that the fiber optical cable is cleaved or cut in half to form a first portion 305 and a second portion 307.

Figure 4C:
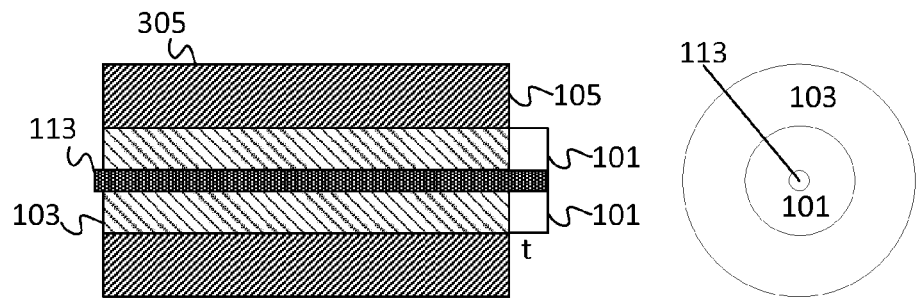
Figure 4D:
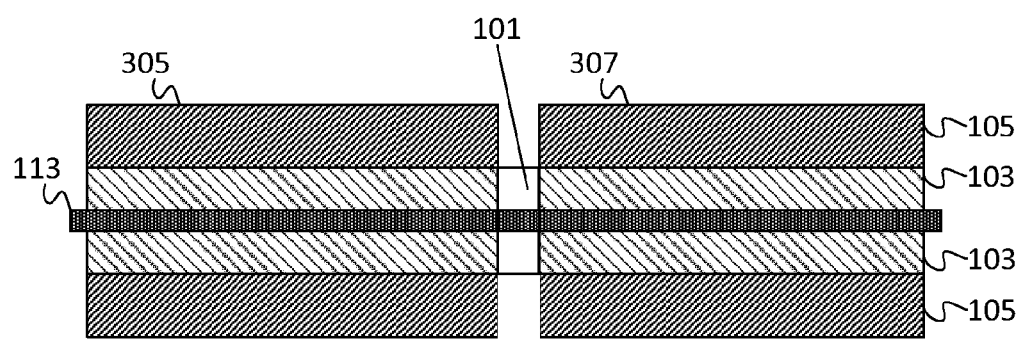

FIG. 4C illustrates the insertion of the attenuating spacer 101 in the first portion 305 of the fiber optic cable or optical waveguide. A portion of the cladding 103 is trimmed from the first portion 305. The attenuating spacer 101 is placed where the portion of the cladding 103 is removed. The attenuating spacer 101 may be a piezoelectric material in a thickness t, in the direction of the cable, of 3-50 microns (e.g., 5 microns, 10 microns). The procedure for placing the piezoelectric material may be deposition or evaporation. The procedure may involve a chemical reaction caused by dipping the core 113 into a solution. The procedure may involve exposing the core 113 to a vacuum and injecting gas with particles of the piezoelectric material, which condense on the core 113. The procedure may be repeated to form layer over layer until the desired thickness of the piezoelectric material is obtained.

The piezoelectric material may be sized to be the same area as the cladding 103. Alternatively, the piezoelectric material may be sized smaller than the cladding 103. Selection of the size of the piezoelectric material may be a balance between the force needed to separate the first portion 305 and 307 and the current needed to stimulate the piezoelectric material. The piezoelectric may be sized larger than the cladding 103 and some of the protection layer 105 may be removed.

FIG. 3D illustrates that the first portion 305 and the second portion 307 are joined together using a splicing technique. The splicing technique may include gluing the first portion 305 and the second portion 307 back together in precise alignment. The splicing technique may include a mechanical splice that holds the first portion 305 and the second portion 307 in alignment, which may be referred to as sleeving. The mechanical splice accurately aligns the two portions of the core to minimize losses. The splicing technique may omit any arcing or heat fusing processes.

The wires 107 are attached to the attenuating spacer 101 using conductive glue. Optionally, a flexible ring 109 is placed around the removed section of the protective layer 105. For further protection, a heat shrink micro sleeve or wrap may be securely attached around the entire variable optical attenuator 100.

Figure 5:
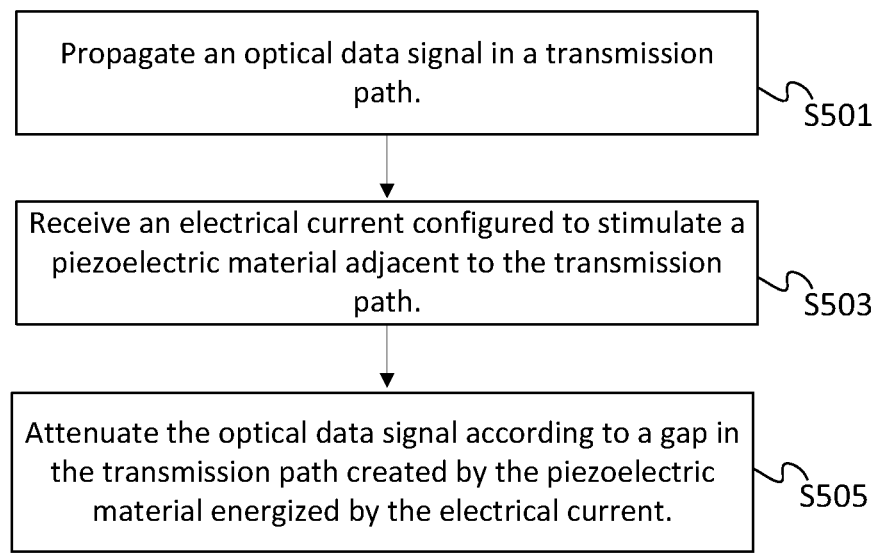
FIG. 5 illustrates an example algorithm for variably attenuating an optical signal.

FIG. 5 illustrates an example algorithm for variably attenuating an optical signal. At S501, at least one optical signal propagates through a transmission path. The transmission path may be part of an optical link such as an optical amplifier, an optical transceiver, or an optical fiber.

At S503, a piezoelectric material adjacent to the transmission path receives an electrical current. The piezoelectric material changes shape in response to the electrical current. The electrical current may be generated based on an attenuation setting on the optical link such as a dial or dip switch. The electrical current may be generated based on a command signal received at the optical link. The electrical current may be generated by a controller querying a lookup table stored in a memory based on a power level detection signal. The power level detection signal is generated by an optical sensor associated with the optical data signal. The controller receives data indicative of the electrical current from the memory.

In one implementation, the electrical current may be calculated by the controller in the optical link according to a detected power of a plurality of channels of the optical data signal. The plurality of channels is separated into a plurality of transmission paths with a demultiplexer. A power level for each of the plurality of channels is detected using an optical sensor or an optical power meter. The controller in the optical link compares the plurality of power levels and identifies a lowest power level. An electrical current for a variable optical attenuator for each of the transmission paths is generated to attenuate each of the plurality of power levels to the lowest power level.

At S505, the change in shape of the piezoelectric material causes a gap in the transmission. The gap attenuates the optical data signal. The attenuation may be selected in the range of 0 dB to 50 dB (e.g., 10 dB, 20 dB). The attenuation is achieved using a very small length of fiber. The entire variable optical attenuator 100 may be as small as 100 microns squared or 50 microns squared. When not energized, the variable optical attenuator 100 may have an insertion loss of 0.05 dB or less and/or a polarization loss dependency of 0.1 dB or less. The variable optical attenuator 100 may operate as transfer speeds in excess of 25 gigabits/second (e.g., 50 Gb/s, 100 Gb/s). The dimensions of the SFP transceiver integrated with the variable optical attenuator 100 may be about 8.5 mm tall by 13.7 wide mm by 56.5 mm long as defined by the SFP transceiver multisource agreement (MSA) or INF-8074i Specification published May 12, 2001.

Various embodiments described herein can be used alone or in combination with one another. The foregoing detailed description has described only a few of the many possible implementations of the present embodiments. For this reason, this detailed description is intended by way of illustration, and not by way of limitation.

I claim:

1. A method comprising:
    cleaving an optical fiber into a first portion and a second portion, wherein the optical fiber comprises a core and a cladding;
    removing a portion of the cladding from the first portion of the optical fiber;
    inserting a smart material in place of the portion of the cladding; and
    rejoining the first portion of the optical fiber and the second portion of the optical fiber.

2. The method of claim 1, wherein rejoining the first portion of the optical fiber and the second portion of the optical fiber comprises applying a heat sink wrap to the optical fiber.

3. The method of claim 1, wherein the smart material is a piezoelectric material.

4. The method of claim 1, wherein inserting the smart material comprises depositing or evaporating a piezoelectric material.

5. The method of claim 1, wherein inserting the smart material comprises:
    positioning the smart material relative to the cladding such that the smart material, in response to an external stimulus, increases an attenuating gap in the core.

6. The method of claim 5, further comprising:
    receiving, at the smart material, an electrical current as the external stimulus.

7. The method of claim 5, further comprising:
    surrounding the smart material with a flexible ring to protect the smart material.

8. The method of claim 1, wherein inserting the smart material comprises:
    exposing the core to a vacuum and injecting a gas with particles of piezoelectric material that condenses on the core.

9. An apparatus comprising:
    an optical waveguide cloven into a first portion and a second portion, the optical waveguide comprising a core and a cladding; and
    a smart material disposed against the first and second portions of the optical waveguide, the smart material being configured to:
        replace a portion of the cladding removed from the first portion of the optical waveguide;
        rejoin the first portion of the optical waveguide and the second portion of the optical waveguide; and
        increase an attenuating gap in the core in response to an external stimulus applied to the smart material.

10. The apparatus of claim 9, further comprising:
a heat sink wrap applied to the optical waveguide to surround the smart material.

11. The apparatus of claim 10, further comprising:
a connector coupled with the smart material to receive, as the external stimulus, an electrical current.

12. The apparatus of claim 10, wherein the smart material is configured to increase the attenuating gap in the core in response to an increase in the electrical current.

13. The apparatus of claim 9, wherein the smart material is a piezoelectric material deposited or evaporated against the first and second portions of the optical waveguide.

14. The apparatus of claim 9, wherein the optical waveguide is an optical fiber in a fiber optic cable.

15. The apparatus of claim 9, wherein the smart material has an outer diameter sized larger than an outer diameter of the cladding.

16. The apparatus of claim 9 further comprising a controller configured to:
receive a setpoint for an electrical current; and
generate the electrical current according to the setpoint as the external stimulus applied to the smart material.

17. A method comprising:
applying an external stimulus to a smart material disposed against a first portion of an optical waveguide, the optical waveguide being cloven into the first portion and a second portion and the smart material being surrounded by a flexible ring rejoining the first portion to the second portion of the optical waveguide; and
increasing the external stimulus to increase a size of the smart material, wherein increasing the size of the smart material exerts a force against the first portion and the second portion of the optical waveguide that increases an attenuating gap in a core of the optical waveguide.

18. The method of claim 17, further comprising:
receiving a setpoint for an electrical current; and
generating the electrical current according to the setpoint as the external stimulus applied to the smart material.

19. The method of claim 18, further comprising:
adjusting the setpoint to increase or decrease the attenuating gap, wherein increasing the electrical current increases a size of the attenuating gap and decreasing the electrical current decreases the size of the attenuating gap.

20. The method of claim 19, wherein the size of the attenuating gap varies in a linear relationship relative to the electrical current.

* * * * *